United States Patent
Chiu et al.

[11] Patent Number: 6,125,644
[45] Date of Patent: Oct. 3, 2000

[54] CONTAINER OF COOLANT

[75] Inventors: Shih-Hsun Chiu, Hsinchu Hsien; Li-Chung Lee, Iian Hsien; Wei-Sheng Chia, Hua-Lien; Patrick Cheng, Kaoshiung Hsien, all of Taiwan

[73] Assignee: United Microelectronics, Corp., Taiwan

[21] Appl. No.: 09/075,421

[22] Filed: May 8, 1998

[30] Foreign Application Priority Data

Apr. 3, 1998 [TW] Taiwan .................................. 87205036

[51] Int. Cl.[7] .............................. F28D 15/00; F25D 23/12
[52] U.S. Cl. .................................... 62/259.2; 165/104.32; 237/248; 437/248
[58] Field of Search ......................... 237/66; 165/104.32, 165/80.4, 80.1, 104.33; 138/30; 62/259.2, 99, 201; 437/248; 118/724

[56] References Cited

U.S. PATENT DOCUMENTS

| | | | |
|---|---|---|---|
| 2,134,802 | 11/1938 | Rentz | 62/435 X |
| 3,593,747 | 7/1971 | Mercier | 138/30 |
| 3,820,593 | 6/1974 | Pabst | 165/104.32 X |

FOREIGN PATENT DOCUMENTS 3021918  12/1980  Germany ........................ 165/104.32

*Primary Examiner*—William Wayner
*Attorney, Agent, or Firm*—Christie, Parker & Hale, LLP

[57] ABSTRACT

A container of coolant used in a NIKON™ stepper is utilizing a screw cap to air-tightly close a coolant inlet of the container of coolant. The container of coolant is a closed system except the coolant inlet, a circulative input duct and a circulative output duct.

9 Claims, 3 Drawing Sheets

CONTAINER OF COOLANT

CROSS-REFERENCE TO RELATED APPLICATION

This application claims the priority benefit of Taiwan application serial no. 87205036, filed Apr. 3, 1998, the full disclosure of which is incorporated herein by reference.

BACKGROUND OF THE INVENTION

1. Field of the Invention

This invention relates to a container of coolant used in a stepper, and more particularly to a container of coolant utilizing a screw cap to air-tightly close a coolant inlet of the container of coolant.

2. Description of Related Art

The products of integrated circuits (ICs) are existing everywhere in our daily life but the fabricating procedure of the products of ICs is very complicated. Generally, it needs a few hundreds of different steps and takes one or two months to compete a production. The industry of ICs has four main categories including the design of ICs, the fabrication of a wafer, the test of a wafer and the package of a wafer. Therefore, the industry of ICs not only needs a high technology of science but also needs a great amount of funds to support and keep the continuous developing. This causes a high risk on the industry of ICs.

From the point of view of the fabrication of a wafer, it further includes oxidation, diffusion, deposition, pattern, etching and so on. In the fabricating procedure of photolithography, so far, a stepper is usually applied for the fabrication of a wafer.

While a stepper is under the operation for fabricating the wafer, it is very important to keep the temperature and the humidity of the stepper in a certain acceptable range. If the temperature and the humidity were out of the range, the stepper would produce some errors in the fabricating procedure or even could be breakdown. Therefore, the conventional stepper has made use of coolant for maintaining the temperature and the humidity.

Freon ($CCl_2F_2$), a coolant, is odorless, nonpoisonous, nonflammable and noncorrosive so that freon is a good candidate of coolant and, thus, is widely used in the stepper, which has a container of coolant to avoid the problems due to the temperature and humidity having been out of acceptable range.

FIG. 1 illustrates the top view of a conventional container of coolant. FIG. 2 illustrates the front view of a conventional container of coolant. FIG. 3 illustrates the perspective view of an exploded conventional container of coolant.

Referring to FIGS. 1–3, a conventional container of coolant 9 used in a NIKON™ stepper 8 with being mounted on machines of types I8, I9 and I10. The structure of the container of coolant 9 includes a storing container 10, a metal plate 14 and a washer 12. The storing container 10 is made of stainless steel and is used for storing a coolant. The storing container 10, with a top and a bottom, has a coolant inlet 11 on the top. The coolant inlet 11 is closed by tightly screwing the six screws 16. The screws 16 distributed evenly on the rim of the metal plate 14 are through the metal plate 14 and the washer 12 to be screwed tightly on the storing container 10. The metal plate 14 has an up-lifter 18 around the center to allow the metal plate 14 to be lifted up. The storing container 10 further has four mounting holes 20 on the bottom for allowing the storing container 10 to be mounted on the stepper 8. In addition, the storing container 10 has a circulative output duct 22 and a circulative input duct 24 for connection with a coolant compressor 100 as shown FIG. 2. The coolant compressor 100 processes the coolant and drives the coolant in circulation through the circulative ducts 22, 24.

For the conventional container of coolant 9, as described above, the coolant inlet 11 is closed by using six screws 16 to tighter the metal plate 14 and the washer 12. If the exerted tightness on each of the screws 16 is not uniform, coolant can leak out from a gap on the periphery of each of the screws 16. Moreover, the leakage of coolant can possibly happen on the up-lifter I8 even though the up-lifter 18 is convenient for lifting the metal plate. If the leakage happens, the insufficient coolant can easily induce the problems on the stepper 8 and cause the errors.

In the description above, the conventional container of coolant 9 has some drawbacks as follows:

1. The method to close the coolant inlet 11 is using six crews 16 through the metal plate and the washer 12 to screw tightly on the storing container 10. If the exerted tightness on each of the screws 16 is not uniform, coolant can leak out from the gap on the periphery of each of the screws 16.

2. The leakage of coolant can possibly happen on the up-lifter 18 even though the up-lifter 18 is convenient for lifting the metal plate.

SUMMARY OF THE INVENTION

It is therefore an objective of the present invention to provide a container of coolant with a screw cap for storing a coolant, The screw cap closes a coolant inlet to solve the drawbacks of the air-tightness in the conventional container of coolant. It, therefore, avoids the breakdown of the stepper due to a leakage of the coolant from the container of coolant.

In accordance with the foregoing and other objectives of the invention, the container of coolant used in the stepper includes a storing container and a screw cap. The screw cap includes a female screw thread on an inner periphery of the screw cap. The storing container includes a cylindrical protuberance on the top. The cylindrical protuberance includes a male screw thread to be tightly closed by the screw cap. The cylindrical protuberance has a void long its center line to act as a coolant inlet for filling the coolant. The storing container further includes a circulative output duct and a circulative input duct which are to be connected to a circulative cooling system located inside the stepper.

In forgoing, the container of coolant is a closed system except the coolant inlet, the circulative output duct and the circulative input duct. This solves the drawbacks of the air-tightness in the conventional container of coolant to avoid the leakage of the coolant. It, therefore, can avoid the insufficient coolant in the stepper, which causes the problems or breakdown of the stepper.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 1:
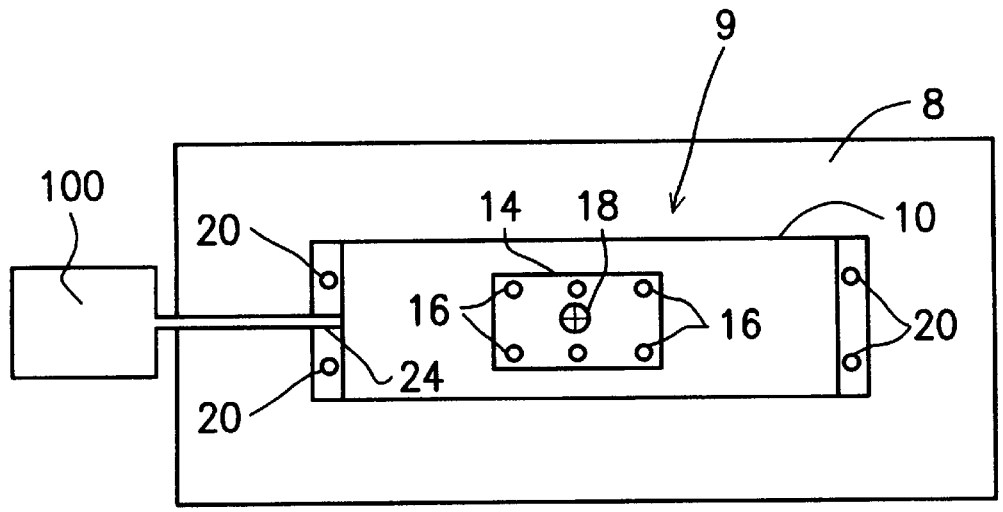
FIG. 1 illustrates the top view of a conventional container of coolant.
Figure 2:
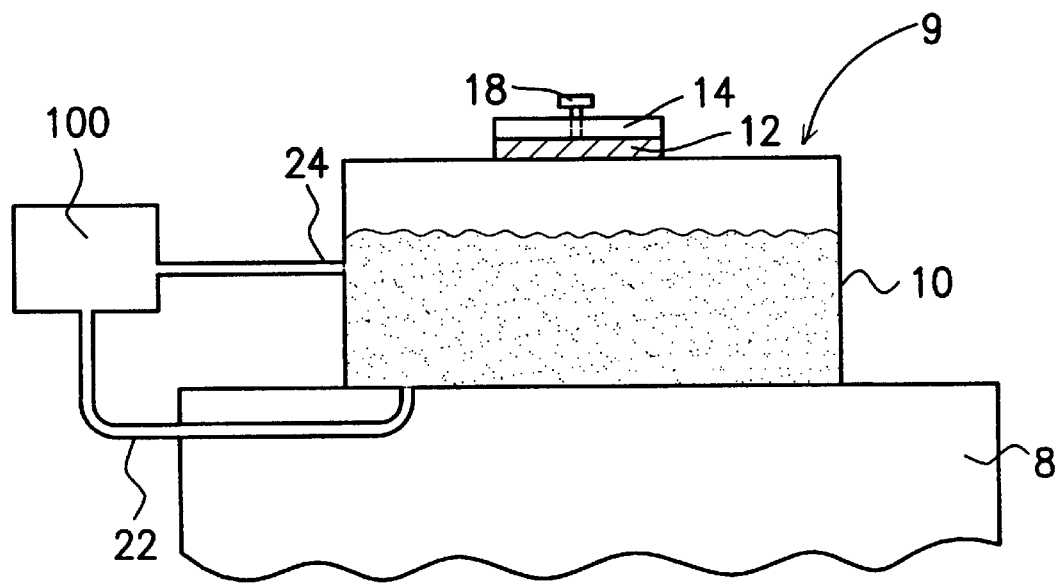
FIG. 2 illustrates the sectional view of a conventional container of coolant.
Figure 3:
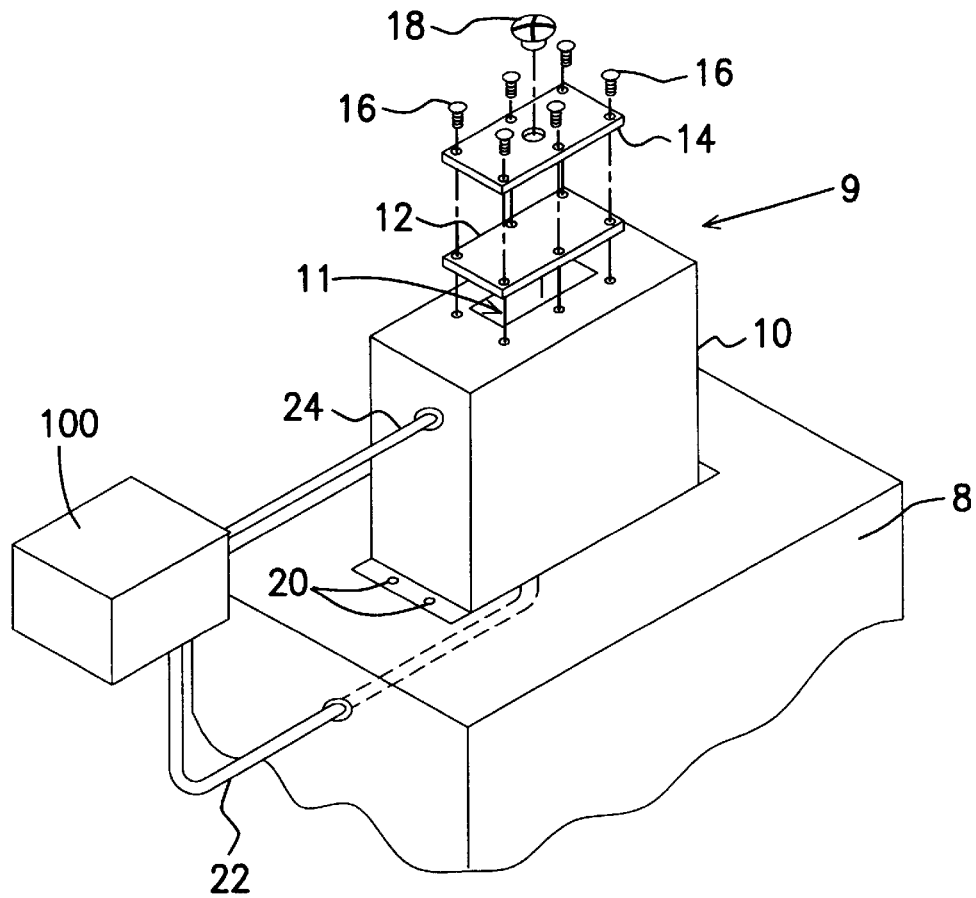
FIG. 3 illustrates the perspective view of an exploded conventional container of coolant.
Figure 4:
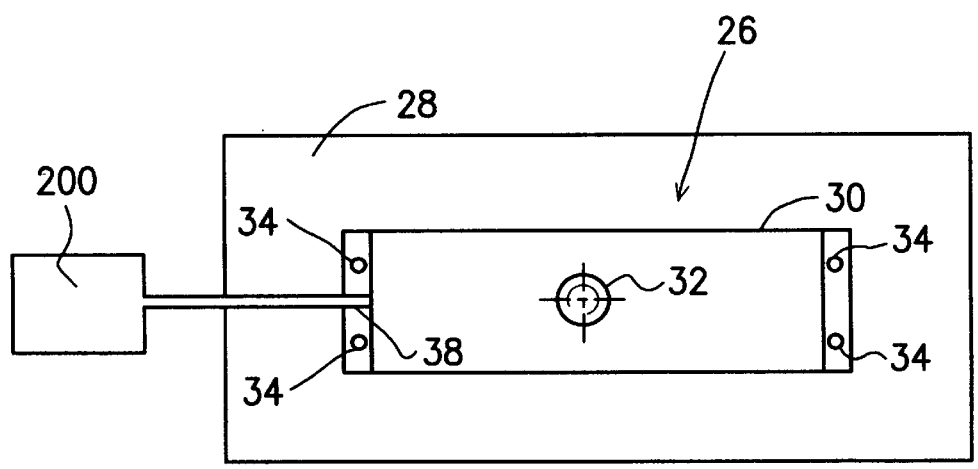
FIG. 4 illustrates the top view of a container of coolant according to the preferred embodiment of the invention.
Figure 5:
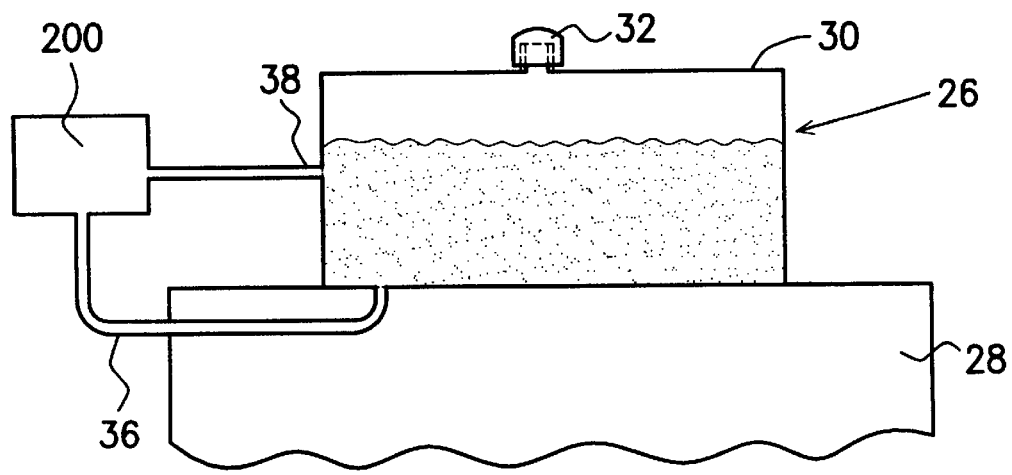
FIG. 5 illustrates the sectional view of a container of coolant according to the preferred embodiment of the invention.
Figure 6:
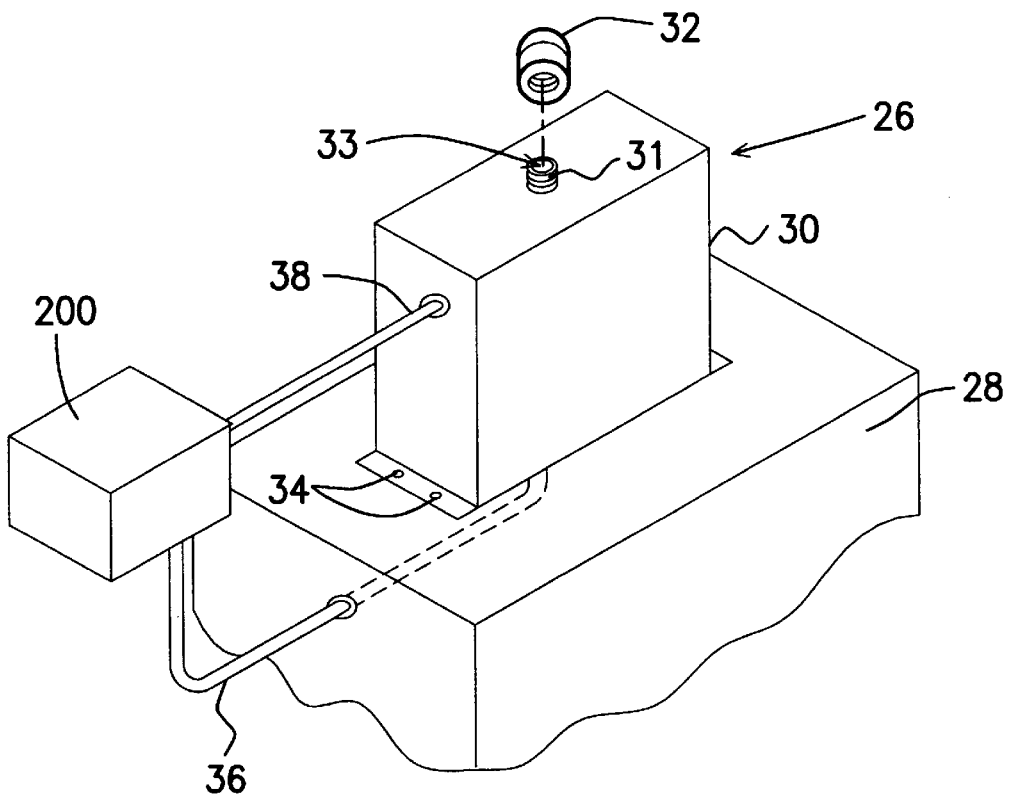
FIG. 6 illustrates the perspective view of an exploded container of coolant according to the preferred embodiment of the invention.

Referring to FIGS. 4–6, a container of coolant 26 for containing a coolant, according to the preferred embodiment of the invention, is used in a stepper 28, For example, The container of coolant 26 is mounted on machines of type I8, I9 and I10 of a NIKON™ stepper. The structure of the container of coolant 26 includes a storing container 30 and a screw cap 32. The storing container 30, made of stainless steel, having a top and a bottom, is used for storing a coolant. The storing container 30 includes a cylindrical protuberance 31 on the top with a male screw thread on an outer periphery of the cylindrical protuberance 31 and an void along a center line of the cylindrical protuberance 31, in which the void through the storing container functions as a coolant inlet 33. The coolant inlet 33 is closed tightly by the screw cap 32, which is a cap with a female screw thread on an inner periphery of the screw cap and can be screwed on the cylindrical protuberance 31 to close the coolant inlet 33. The screw cap 32 is made of stainless steel, which is the same as the material used for the storing container 30 to keep the same properties such as the same expansibility. Through the male and female screw threads, the screw cap can air-tightly close the cylindrical protuberance 31, where is also the coolant inlet 33.

The storing container 30 also includes a number of mounting holes such as four mounting holes 34 on the bottom for being mounted on the stepper 28. The storing container 30 further includes a circulative output duct 36 and a circulative input duct 38 to be connected to a coolant compressor 200. The coolant compressor 200 processes the coolant and drives the coolant in circulation through the circulative ducts 42, 44.

The container of coolant 26 in the invention, therefore, is a closed system except the coolant inlet 33, the circulative output duct 36 and the circulative input duct 38, which has only a small aperture area. The air-tightness of the container of coolant 26 has been significantly improved.

Therefore, the characteristics of the invention is following:
1. The invention utilizes a screw cap 32 for replacing the metal plate 14 and the washer 12 in the conventional storing container 10 to solve the leakage of coolant by increasing the air-tightness.
2. The storing container 30 in the invention is a closed system except the coolant inlet 33, the circulative input duct and the circulative output duct. This results in a prevention of the leakage of the coolant.

In conclusion, the container of coolant according to the preferred embodiment of the invention has enhanced the air-tightness of the container of coolant by utilizing a screw cap so that the problems of the leakage of coolant in the conventional container are solved.

The invention has been described using exemplary preferred embodiment. However, it is to be understood that the scope of the invention is not limited to the disclosed

What is claimed is:

1. A container of coolant used in a stepper, the container of coolant comprising:

a storing container used for containing a coolant, wherein the storing container includes a plurality of mounting holes for being mounted on the stepper;

a cylindrical protuberance on the top of the storing container with a male screw thread on an outer periphery of the cylindrical protuberance and a void along a center line of the cylindrical protuberance and through the storing container to form a coolant inlet; and a screw cap, wherein the screw cap comprises a female screw thread on an inner periphery of the screw cap to match the male screw thread of the cylindrical protuberance for air-tightly closing the coolant inlet.

2. The container of coolant of claim 1, wherein the storing container comprises a circulative output duct and a circulative input duct, which are to be connected to a coolant compressor, which is to process and to drive the coolant in circulation.

3. The container of coolant of claim 1, the storing container comprises stainless steel.

4. The container of coolant of claim 1, wherein the screw cap is made of stainless steel.

5. A container of coolant according to claim 4, wherein the cylindrical protuberance is made of stainless steel.

6. A container of coolant for use in a stepper, the container of coolant comprising:

a storing container used for containing a coolant, wherein said storing container including a plurality of mounting holes for being mounted on the stepper, said storing container further comprising;

a cylindrical protuberance on the top of the storing container with a male screw thread on an outer periphery of the cylindrical protuberance, and a void along a center line of the cylindrical protuberance and through the storing container to form a coolant inlet; and a screw cap, wherein the screw cap comprises a female screw threaded on an inner periphery of the screw cap to match the male screw thread of the cylindrical protuberance for air-tightly closing the coolant inlet, and wherein the screw cap is made of a material the same as that of the cylindrical protuberance.

7. A container of coolant according to claim 6, wherein the storing container comprises a circulative output duct and a circulative input duct, both of which are adapted to be connected to a coolant compressor to process and drive the coolant in circulation.

8. A container of coolant according to claim 6, wherein the storing container comprises stainless steel.

9. A container of coolant according to claim 6, wherein the screw cap and the cylindrical protuberance are both made of stainless steel.

* * * * *